US012388054B2

(12) United States Patent
Li

(10) Patent No.: US 12,388,054 B2
(45) Date of Patent: Aug. 12, 2025

(54) ELECTRONIC DEVICE BENEFICIAL OF RETAINING SLIGHTLY POWER DROP

(71) Applicant: PanelSemi Corporation, New Taipei (TW)

(72) Inventor: Chin-Tang Li, New Taipei (TW)

(73) Assignee: PANELSEMI CORPORATION, New Taipei (TW)

( * ) Notice: Subject to any disclaimer, the term of this patent is extended or adjusted under 35 U.S.C. 154(b) by 510 days.

(21) Appl. No.: 17/877,257

(22) Filed: Jul. 29, 2022

(65) Prior Publication Data

US 2023/0036781 A1    Feb. 2, 2023

Related U.S. Application Data

(60) Provisional application No. 63/227,568, filed on Jul. 30, 2021.

(51) Int. Cl.
| | | |
|---|---|---|
| *H01L 25/075* | (2006.01) | |
| *H10D 86/40* | (2025.01) | |
| *H10D 86/60* | (2025.01) | |
| *H10H 20/857* | (2025.01) | |

(52) U.S. Cl.
CPC ....... *H01L 25/0753* (2013.01); *H10D 86/441* (2025.01); *H10D 86/60* (2025.01); *H10H 20/857* (2025.01)

(58) Field of Classification Search
CPC . H01L 25/0753; H01L 25/167; H10D 86/441; H10D 86/60; H10H 20/857
See application file for complete search history.

(56) References Cited

U.S. PATENT DOCUMENTS

| | | | |
|---|---|---|---|
| 6,914,375 B2* | 7/2005 | Lee | H01J 29/07 313/402 |
| 12,080,836 B2* | 9/2024 | Li | H01L 21/48 |

* cited by examiner

*Primary Examiner* — Tan N Tran
(74) *Attorney, Agent, or Firm* — MUNCY, GEISSLER, OLDS & LOWE, P.C.

(57) ABSTRACT

An electronic device includes a first substrate, multiple unit tiles, multiple electrical components, multiple holes, and multiple conductors. The first substrate includes a first patterned trace, multiple driving members electrically connected with the first patterned trace, and multiple pads electrically connected with the first patterned trace and respectively corresponding with the driving members. Each of the unit tiles defines a second face and a first face opposing to each other, the electrical components are disposed on the second faces of the unit tiles, and the conductors are exposed from the first faces of the unit tiles and respectively corresponding with the electrical components. The conductors are arranged in the holes respectively and overlapping the pads of the first substrate respectively for electrically connecting the electrical components to the pads of the first substrate, wherein the conductors are underneath the second faces of the unit tiles.

16 Claims, 12 Drawing Sheets

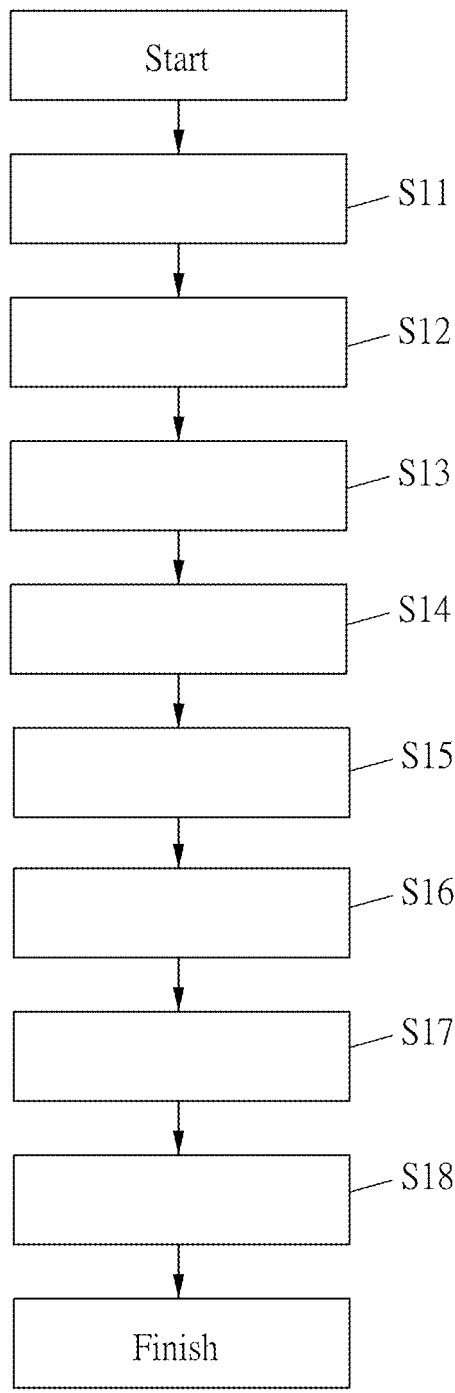
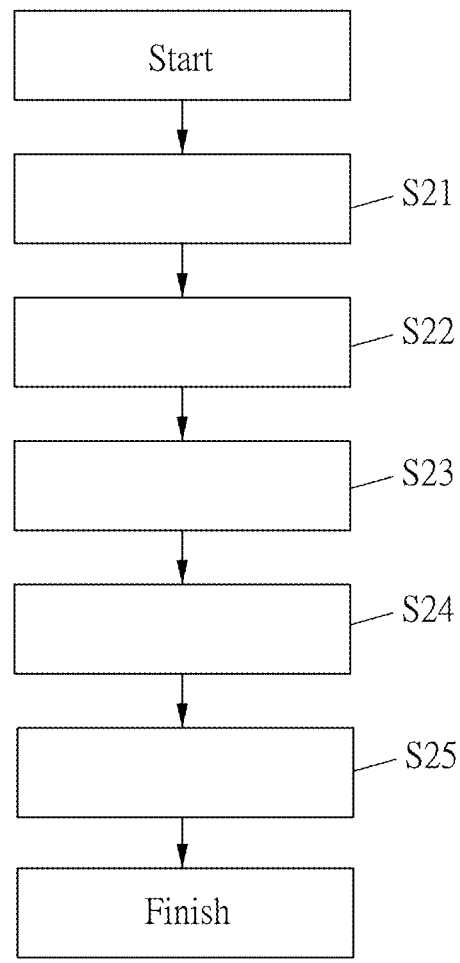
FIG. 1A
FIG. 1B

ELECTRONIC DEVICE BENEFICIAL OF RETAINING SLIGHTLY POWER DROP

CROSS REFERENCE TO RELATED APPLICATIONS

The non-provisional patent application claims priority to U.S. provisional patent application with Ser. No. 63/227,568 filed on Jul. 30, 2021. This and all other extrinsic materials discussed herein are incorporated by reference in their entirety.

BACKGROUND

Technology Field

This disclosure relates to an electronic device and a method for fabricating the same.

Description of Related Art

The application of display apparatus becomes more diversified, and the use of large display or display billboards for displaying public information, advertisements or entertainment is becoming more and more popular in major exhibition halls, department stores or cinemas. To build up such a large scale of the display, tiling displays constituting multiple display panels have become one of the common configurations. In general, there are one display and one driving board connected with each other as one single display module or display tile unit, the costs and the fabrications are depending and various on the sizes and functions of the display, and to put the display modules tiled together to form a large-scale display.

As it is known of that the difficulties of large-scale displays results from the expensive IC chips, IC chiplets, or thin-film transistor processes with photomasks, substrates, and/or materials needed thereof, or the power drop occurred in the large-scale display due to the extreme expansion of the size scale, or the novel design does not suit for the conventional plants so as to there is a need to build up a new one for advanced technologies, and issues et cetera. Especially, the power drop may be an issue when it comes with environmentally friendly. Hence, a novel electronic device and a method of making the same, which is beneficial of retaining slightly power drop with budget cost, is required in urge.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments of the present invention are directed to making an electronic device and an electronic device thereof being beneficial of retaining slightly power drop with budget cost.

Embodiments of the present invention are directed to an electronic device, comprising: a first substrate, a plural of unit tiles, and a plural of electrical components. The first substrate includes a first patterned trace and pads, and ones or more of the pads electrically connect the first patterned trace. The unit tiles connect the first substrate, each of the unit tiles includes one or more second patterned traces, the second patterned trace includes one or more suppletory traces and one or more functional circuits, and one or ones of the suppletory traces and one or ones of the functional circuits are isolated with each other. The electrical components are arranged on the unit tiles and electrically connected with the one or ones of functional circuits of the second patterned traces. Each of the functional circuits is electrically connected with the first patterned trace, and the one or more suppletory traces and corresponding ones of the first patterned traces of the first substrate are electrically connected in parallel.

In one aspect of the present disclosure in the above device, an equivalent resistance from the electrical parallel connection between the one or more suppletory traces and corresponding ones of the first patterned trace of the first substrate is formed to be less than an impedance of the first patterned trace.

In one aspect of the present disclosure in the above device, dimensions of the electrical components are on or under the level of micrometer scale.

In one aspect of the present disclosure in the above device, dimensions of the unit tiles are on the level of millimeter scale.

In one aspect of the present disclosure in the above device, ones of the electrical components are arranged in an array on a corresponding one of the unit tiles.

In one aspect of the present disclosure in the above device, a plural of functional units are defined on the unit tiles respectively, one or ones of the electrical components is/are defined in a corresponding one of the functional units.

In one aspect of the present disclosure in the above device, ones of the functional units are arranged on a corresponding one of the unit tiles in a matrix of m by n, wherein m and n are positive integers.

In one aspect of the present disclosure in the above device, the electronic device further comprises a cover member covers the unit tiles.

In one aspect of the present disclosure in the above device, the cover member is a cover glass.

In one aspect of the present disclosure in the above device, the electronic device further comprises a driving members arranged either on the first substrate or on a corresponding one of the unit tiles, and electrically connected with the corresponding one of the unit tiles.

In one aspect of the present disclosure in the above device, the electronic device further comprises a plural of functional units defined on the unit tiles respectively, wherein one or ones of the electrical components is/are defined in a corresponding one of the functional units.

In one aspect of the present disclosure in the above device, the electronic device further comprises one encapsulation layer covers one or ones of the electrical components, one or ones of the functional units, or each of the unit tiles.

In one aspect of the present disclosure in the above device, an impedance of the suppletory trace is less than the impedance of the first patterned trace at a constrained interval.

In one aspect of the present disclosure in the above device, the electronic device further comprises a plural of conductive structures, ones of the conductive structures electrically connect a corresponding one of the suppletory traces with the first patterned trace.

In one aspect of the present disclosure in the above device, the conductive structures include a plural of the holes formed through the unit tiles, and a plural of conductors arranged in the holes respectively; wherein ones or all of the holes respectively corresponding with the electrical components, and ones of the conductors electrically connect the electrical components to ones of the pads of the first substrate.

In one aspect of the present disclosure in the above device, each of the unit tiles defines a first face facing the first substrate and a second face opposing to the first face, and the conductors are underneath the second patterned trace.

In one aspect of the present disclosure in the above device, the electronic device further comprises a planarization layer formed on the first face of one of the unit tiles, wherein the holes are formed through the planarization layer, and a distal end of one or ones of the conductive members approaches the planarization layer and is surrounded by the planarization layer.

In one aspect of the present disclosure in the above device, the first patterned trace is formed of IGZO (Indium Gallium Zinc oxide), a-IGZO (amorphous Indium Gallium Zinc oxide), LTPS (polycrystalline Silicon), or a-Si (amorphous Silicon).

In one aspect of the present disclosure in the above device, the driving member is a transistor formed of IGZO (Indium Gallium Zinc oxide), a-IGZO (amorphous Indium Gallium Zinc oxide), LTPS (polycrystalline Silicon), or a-Si (amorphous Silicon), or are IC chips or IC chiplets.

In one aspect of the present disclosure in the above device, the electrical components are photoelectrical components.

In one aspect of the present disclosure in the above device, the photoelectrical components are red, green, and blue LEDs.

In one aspect of the present disclosure in the above device, the photoelectrical components are blue LEDs, a color transformer is disposed over the photoelectrical components.

In one aspect of the present disclosure in the above device, the electronic device further comprises the color transformer is disposed between the electrical components and the cover member.

In one aspect of the present disclosure in the above device, the color transformer includes a color conversion layer.

In one aspect of the present disclosure in the above device, the color transformer includes a color filter layer covering the color conversion layer.

In one aspect of the present disclosure in the above device, the color conversion layer is a QD film.

In one aspect of the present disclosure in the above device, the color transformer is hybrid and functioned of color conversion and color filter.

In one aspect of the present disclosure in the above device, the photoelectrical components are mixed of red LEDs and green LEDs, and the electronic device further comprises a color transformer covering the photoelectrical components.

In one aspect of the present disclosure in the above device, the color transformer includes a color filter layer, which covers the photoelectrical components in a direct manner.

In one aspect of the present disclosure in the above device, the electronic device further comprises a seal member encompassing a peripheral formed between first substrate and the cover member.

Embodiments of the present invention are directed to a method for fabricating an electronic device, comprising steps of: providing a base substrate, wherein each of the base substrate is provide with one or more second patterned traces and a plural of electrical components in an array; implementing a plural of holes on the base substrate, wherein the holes are formed from one face of the base substrate while the electrical components are arranged on an opposite face of the base substrate; wherein ones or all of the holes respectively correspond with the electrical components; arranging a plural of conductors in the holes respectively, and ones of the conductors electrically connecting the electrical components; slicing the base substrate into unit tiles, wherein ones of the electrical components are set in each of the unit tiles; and approaching the unit tiles to a first substrate via the corresponding one of the faces with which the conductors accommodate, and electrically connecting ones of the conductors to a plural of pads of the first substrate; wherein each of the unit tiles includes a second patterned trace with one or more suppletory traces, one of the first patterned traces is arranged on a corresponding one of the first substrates, ones of the pads electrically connect with a corresponding one of the first patterned traces; the second patterned trace electrically connected with the first patterned trace, and the one or more suppletory traces and the first patterned trace are electrically connected in parallel.

In one aspect of the present disclosure in the above method, an equivalent resistance from the electrical parallel connection between the one or more suppletory traces and corresponding ones of the first patterned trace of the first substrate is formed to be less than an impedance of the first patterned trace.

In one aspect of the present disclosure in the above method, ones of the conductors are partially exposed of a corresponding one of the faces of the base substrate.

In one aspect of the present disclosure in the above method, the method further comprises step of providing a cover member covering the unit tiles.

In one aspect of the present disclosure in the above method, the method further comprises step of providing a seal member encompassing a peripheral formed between first substrate and the cover member.

In one aspect of the present disclosure in the above method, the method further comprises step of providing a plural of functional units on the base substrate, and one or ones of the electrical components are arranged to a corresponding one of the functional units.

In one aspect of the present disclosure in the above method, ones of the functional units are arranged on a corresponding one of the unit tiles in a matrix of m by n, wherein m and n are positive integers.

In one aspect of the present disclosure in the above method, the method further comprises step of providing a second patterned trace on the base substrate, in which the electrical components electrically connect to the second patterned trace.

In one aspect of the present disclosure in the above method, in the step of providing the base substrate, the base substrate is further provided with a black matrix layer, which encompasses around the electrical components.

In one aspect of the present disclosure in the above method, the method further comprises step of implementing the holes by laser.

In one aspect of the present disclosure in the above method, the method further comprises step of implementing ones of the holes until arriving the second patterned trace.

In one aspect of the present disclosure in the above method, the method further comprises step of disposing a plural of metallic balls, as the conductors, filled in the holes, and the metallic balls contact the second patterned trace after the step of backing or reflowing.

In one aspect of the present disclosure in the above method, the method further comprises step of electroless plating, pasting, printing, jetting a plural of conductive materials above or in the holes, and the step of backing or reflowing the conductive materials into the conductors filled in the holes to contact the second patterned trace.

In one aspect of the present disclosure in the above method, the method further comprises step of electrically connecting one or ones of the driving members to one or ones of the electrical components arranged in one or ones of the functional units.

In one aspect of the present disclosure in the above method, the method further comprises step of providing one encapsulation layer covers one or ones of the electrical components.

In one aspect of the present disclosure in the above method, the method further comprises step of providing one encapsulation layer covers one or ones of the functional units.

In one aspect of the present disclosure in the above method, the method further comprises step of providing one encapsulation layer covers each of the unit tiles.

In one aspect of the present disclosure in the above method, the method further comprises step of providing a planarization layer on before the holes are formed, the holes are formed through the planarization layer, wherein a distal end of one or ones of the conductive members approaches the planarization layer and is surrounded by the planarization layer.

In one aspect of the present disclosure in the above method, the method further comprises step of providing the electrical components on or under the level of micrometer scale.

In one aspect of the present disclosure in the above method, the method further comprises step of slicing the base substrate by laser.

In one aspect of the present disclosure in the above method, the method further comprises step of providing the base substrate with one or more suppletory traces independent from the second patterned trace in each of the unit tiles, and in the step of approaching the unit tiles to a first substrate, the one or more suppletory traces electrically connecting with the first patterned trace in parallel.

In one aspect of the present disclosure in the above method, the method further comprises step of defining the suppletory trace with two terminals electrically connecting corresponding two of the pads of the first patterned trace.

In one aspect of the present disclosure in the above method, the method further comprises step of having ones of the holes arriving the one or more suppletory traces, and in the step of approaching the unit tiles to a first substrate, the one or more suppletory traces and the first patterned trace are electrically connected in parallel via ones of the conductors.

In one aspect of the present disclosure in the above method, an impedance of the suppletory trace is less than the impedance of the first patterned trace at a constrained interval.

In one aspect of the present disclosure in the above method, the method further comprises step of providing the first patterned trace formed of IGZO (Indium Gallium Zinc oxide), a-IGZO (amorphous Indium Gallium Zinc oxide), LTPS (polycrystalline Silicon), or a-Si (amorphous Silicon).

In one aspect of the present disclosure in the above method, the method further comprises step of providing the driving members being transistors formed of IGZO (Indium Gallium Zinc oxide), a-IGZO (amorphous Indium Gallium Zinc oxide), LTPS (polycrystalline Silicon), or a-Si (amorphous Silicon), or are IC chips or IC chiplets.

In one aspect of the present disclosure in the above method, the method further comprises step of providing the electrical components as photoelectrical components.

In one aspect of the present disclosure in the above method, the photoelectrical components are red, green, and blue LEDs.

In one aspect of the present disclosure in the above method, the photoelectrical components are blue LEDs, and the method further comprises step of providing a color transformer disposed on the photoelectrical components.

In one aspect of the present disclosure in the above method, the method further comprises step of providing the color transformer disposed between the photoelectrical components and the cover member.

In one aspect of the present disclosure in the above method, the method further comprises step of providing the color transformer formed of a color conversion layer.

In one aspect of the present disclosure in the above method, the method further comprises step of providing the color conversion layer formed above photoelectrical components.

In one aspect of the present disclosure in the above method, the method further comprises step of providing the color transformer is further formed a color filter layer covering the color conversion layer before attaching onto the cover member.

In one aspect of the present disclosure in the above method, the method further comprises step of providing the color filter layer being formed on the cover member before attached onto the color conversion layer.

In one aspect of the present disclosure in the above method, the method further comprises step of providing the color transformer being hybrid and functioned of color conversion and color filter.

In one aspect of the present disclosure in the above method, the method further comprises step of providing the photoelectrical components with mixture of red LEDs and green LEDs, and of providing a color transformer covering the electrical components.

In one aspect of the present disclosure in the above method, the method further comprises step of providing the color transformer formed of a color filter layer, which covers the electrical components in a direct manner.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The disclosure will become more fully understood from the detailed description and accompanying drawings, which are given for illustration only, and thus are not limitative of the present disclosure, and wherein:

FIGS. 1A and 1B are flow charts showing the ways to make an electronic device according to more than one embodiment of this disclosure;

DETAILED DESCRIPTION OF THE DISCLOSURE

Figure 2A:
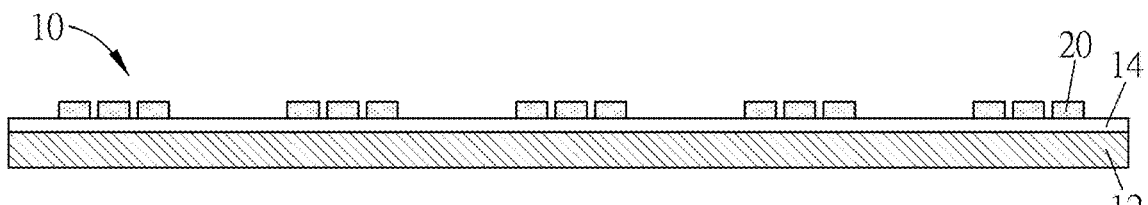
FIGS. 2A to 2H and FIG. 2F' are schematic diagrams showing steps of making the configuration of an electronic device according to FIG. 1A of this disclosure.

Advantages and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a method for fabricating an electronic device for mass production in an effective and efficient manner, according to one embodiment of the present invention will be described with reference to FIG. 1A, FIGS. 2A to 2H, FIGS. 3A and 3B, and FIGS. 4A and 4B, comprising steps S11 to S18, which are described as followed.

Step S11, in which a composite substrate 10 is provided and referred in FIG. 2A. The composite substrate 10 includes a rigid carrier 12, a resilient film 14, for example a PI film but not limited thereto, attached onto the rigid carrier 12, and a plural of electrical components 20 disposed on the resilient film 14. In this case, the electrical components 20 may be on or under the level of micrometer scale.

Figure 2B:
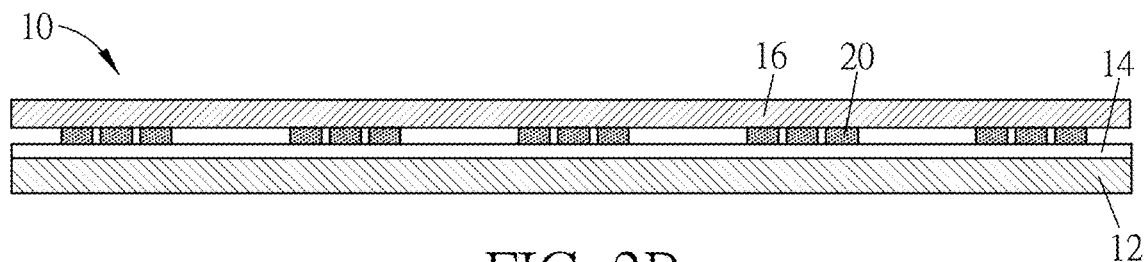

Step S12, in which a support substrate 16, referred in FIG. 2B, is disposed to cover over the electrical components 20. The support substrate 16 here is functioned of support or/and protection such as, for example but not limited to, a rigid material.

Step S13, in which the rigid carrier 12 and the resilient film 14 are removed from each other, and the resilient film 14 is keep stretching due to the support substrate 16.

Figure 2C:
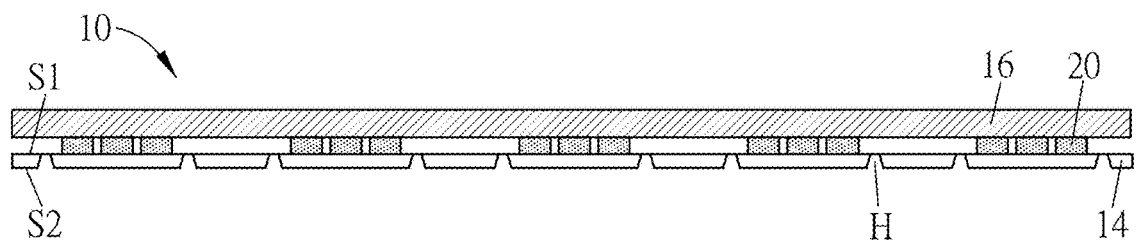

Step S14, in which a plural of holes H are implemented on the resilient film 14, referred in FIG. 2C. Some of the holes H respectively correspond with the electrical components 20. The holes H are formed from one face S1, a first face S1, of the resilient film 14 through an opposite face S2, a second face S2, thereof, while the electrical components 20 are arranged on the opposite face S2 of the resilient film 14.

Figure 2D:
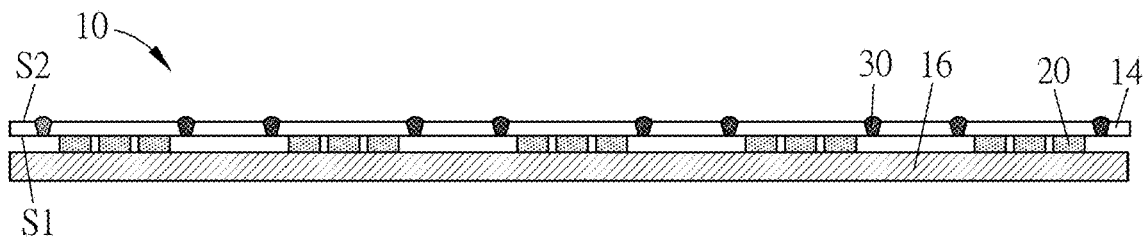
Figure 2E:
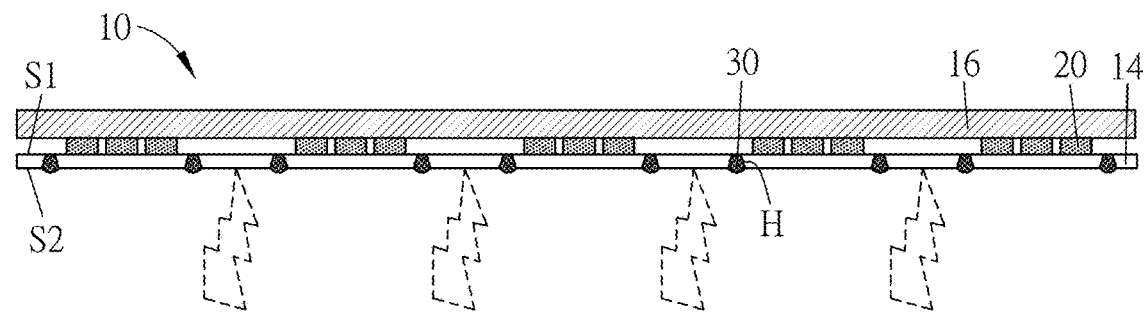

Step S15, in which a plural of conductors 30 are disposed in the holes H respectively, and the conductors 30 electrically connect the first face S1 of the resilient film 14, where the electrical components 20 stand. In one embodiment, ones of the conductors 30 underneath the second face S2 of the resilient film 14 are sealed by a predetermined conducting pad or line; in one embodiment, ones of the conductors 30 climb upon the second face S2 of the resilient film 14 by connecting the predetermined pad or trace. In one embodiment, ones of the conductors 30 are partially exposed of a corresponding face S1, a first face S1, of the resilient film 14, referred in FIGS. 4A and 4B. In one embodiment, the conductors 30 are formed of steps of electroless plating, pasting, printing, or jetting a plural of conductive materials filled in the holes H, and of reflowing or backing the conductive materials turn into the conductors 30 disposed in the holes H. In one embodiment, ones of the conductors 30 are formed within corresponding ones of partial of each of the holes H after plating or immerging, jetting process or any metallic treatment the like, not illustrated, and are capable of further combining with conductive materials filled in the rest of the holes H, and the conductive materials are optionally treated as processes by reflowing, backing, and etc. To be noted, ones of the holes H and corresponding ones of the conductors 30 in accordance with the electrical components 20 are configured for electrical connection, referred in FIG. 4A. The illustration in FIG. 2D is for disposing the conductors 30, while the illustration in FIG. 2E is for laser cutting after disposing the conductors 30. The cutting direction of the laser is provided by either the resilient film 14 or the support substrate 16.

Figure 2F:
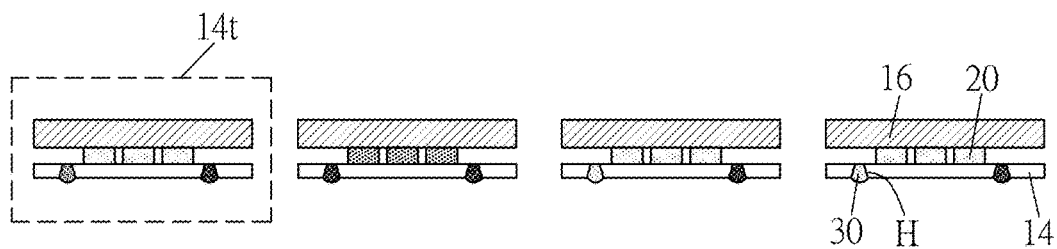
Figure 2F:
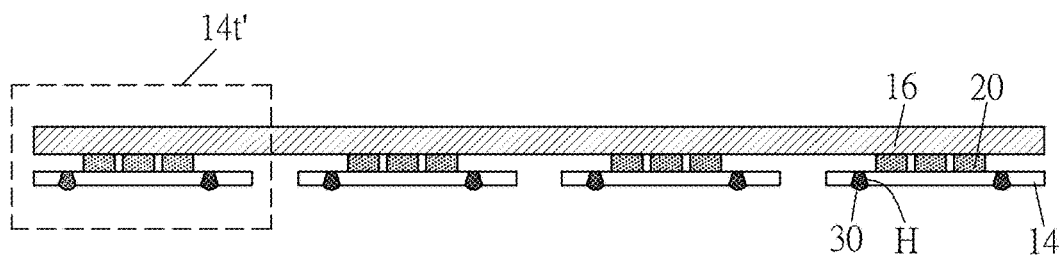

Step S16, in which the resilient film 14 are sliced into a plural of resilient tiles 14t and dividing from each other, referred in FIG. 2F, and ones of the electrical components 20 are set in each of the resilient tiles 14t, after step S15. In this case, the resilient tiles 14t may be on the level of millimeter scale. In another embodiment, referred in FIGS. 2F', the resilient film 14 is sliced into a plural of resilient tiles 14t' but keeping the support substrate 16 as a whole film attached to the resilient tiles 14t'.

Figure 2G:
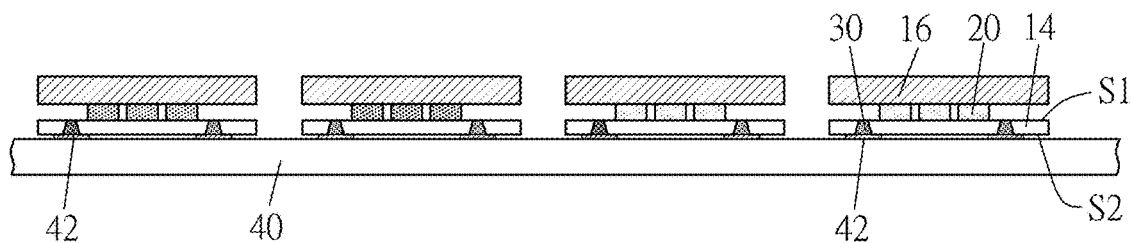

Step S17, in which the resilient tiles 14t approaches a first substrate 40 referred in FIG. 2G, the resilient tiles 14t electrically connected to the first substrate 40 via the conductors 30 electrically connected to a plural of pads 42 of the first substrate 40 respectively. In one case, the electrical connection between the conductors 30 and pads 42 is accomplished by direct bonding; in one case, the electrical connection between the conductors 30 and pads 42 is accomplished by indirect bonding through additional conductive materials.

Figure 5A:
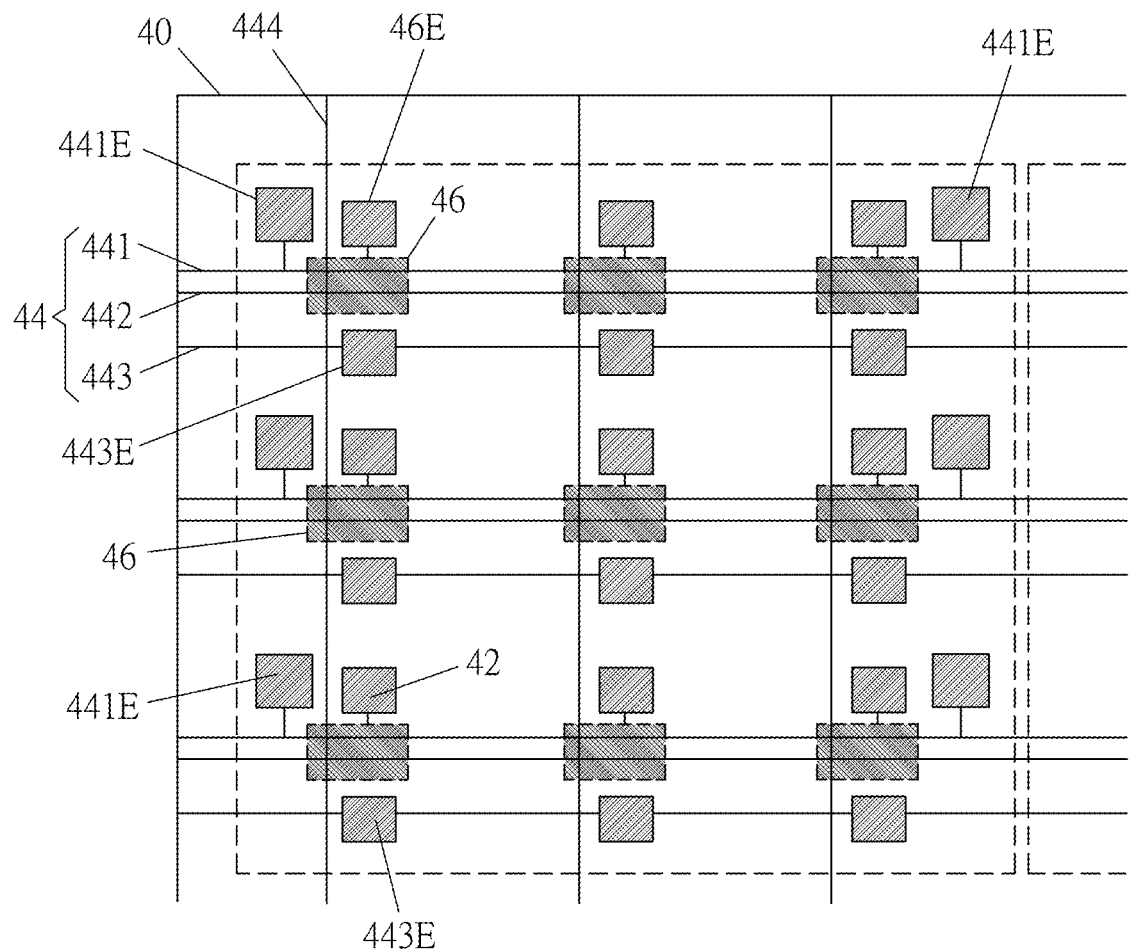
FIGS. 5A to 5D are top views showing the configuration of the electronic device in different steps according to one embodiment of this disclosure.

In this case, the first substrate 40, referred in FIG. 5A, defines a plurality of unit area (UA) functioning of driving and waiting for disposing one or ones of the resilient tiles 14t thereon. The first substrate 40, referred in FIG. 5A, further includes a first patterned trace 44, ones of the pads 42 electrically connects with the first patterned trace 44, and the other ones of the pads 42 are electrically independent and isolated from the previous ones of the pads 42. In one case, a plural of driving members 46 electrically connect with the first patterned trace 44, and the other ones of the pads 42 respectively correspond with and electrically with one or ones of the driving members 46. To be easy comprehension, the first patterned trace 44 include signal traces, such as VDD line 441, V data line 442, V Com line 443, Scan line 444, or the like. The V Com line 443 are electrically independent and isolated from the VDD line 441, V data line 442, and Scan line 444. In this case, the ones of the pads 42 electrically connect with the first patterned trace 44 mean pads are formed or extended from VDD line 441, V data line 442, V Com line 443, Scan line 444 of the first patterned trace 44, and the pads 42 electrically connect with the first patterned trace 44 are further defined as VDD pads 441E, V Com pads 443E, the other ones of the pads 42 electrically with the driving members 46 are defined as driving member pads 46E. Furthermore, the driving members 46 electrically connect with VDD line 441, V data line 442 and Scan line 444 of the first patterned trace 44 and are electrically isolated from the V Com line 443, therefore a circuit works. In one embodiment, one or ones of the driving members 46 are electrically connecting to control one or ones of the electrical components 20 in more than one functional unit 182. In one embodiment, while the driving members 46 are arranged on resilient tiles 14t, the driving member pads 46E corresponding thereof would be omitted, not illustrated. It may require more pads on the first substrate 40 for electrical connection with the driving members 46 on the resilient tiles 14t.

Figure 2H:
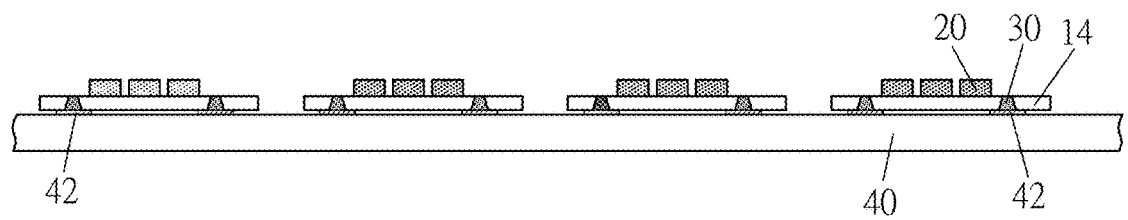

Step S18, in which the support substrate 16 and the resilient tiles 14t are removed from each other, referred in FIG. 2H, and only the resilient tiles 14t are kept on the first substrate 40.

Figure 3A:
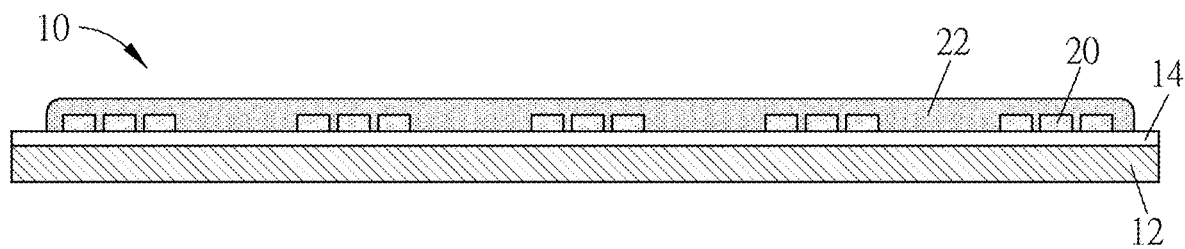
FIGS. 3A to 3C are schematic diagrams showing steps of making encapsulation layer for more than one embodiment of this disclosure.
Figure 3B:
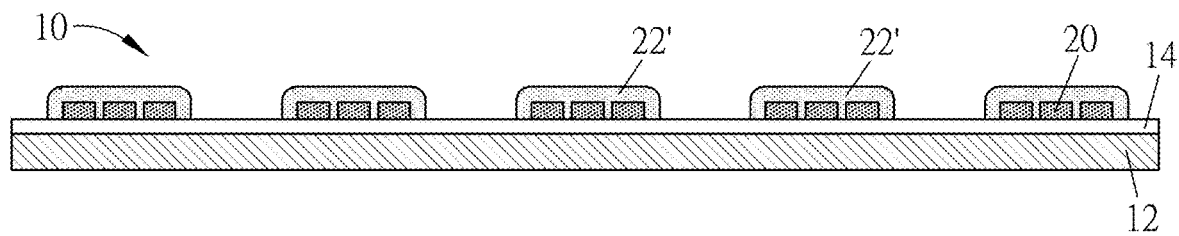
Figure 3C:
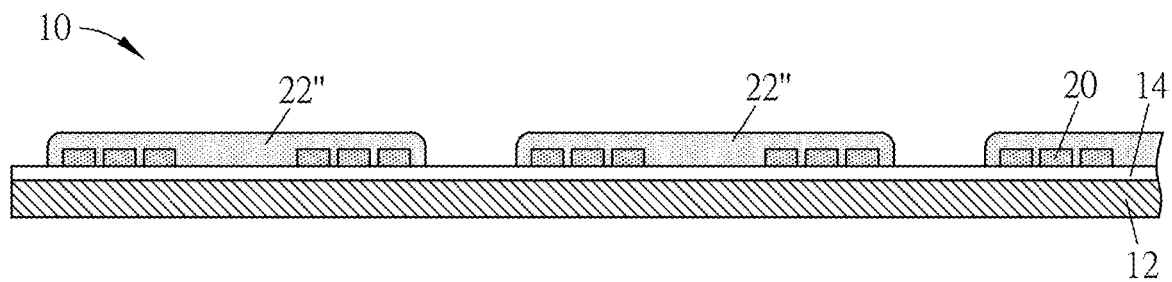

Here are some embodiments for further comprehension in step S11. The electrical components 20 are provided with red, green, and blue LEDs. In one case, one red, one green, and one blue LEDs are defined as one group in one functional unit. In one case, the cover member 70 could be implemented to cover on the electrical components 20. In one embodiment in step S11, all of the electrical components 20 are provided with blue LEDs, and a color transformer is further provided and disposed on the electrical components 20. The color transformer is formed of a color conversion layer, such as for example but not limited to a QD film, formed above the electrical components 20, and is further formed with a color filter layer, in one case, covering the color transformer. The color filter layer could be formed either on the color transformer or the cover member 70 before attached onto the color transformer. In one embodiment, the color transformer could be hybrid and functioned of color conversion and color filter. In one embodiment in step S11, all of the electrical components 20 are mixed of red LEDs and green LEDs, and the color transformer is further provided and disposed on the electrical components 20, in which the color transformer includes the color filter layer covering the electrical components 20 in a direct manner; there would be no color transformer disposed between the electrical components 20 and the color filter layer in this case. In one case, one encapsulation layer 22 may be further provided, referred in FIG. 3A. In one case, there are one or more encapsulation layer 22' to cover one or ones of the electrical components 20 in a one-on-one manner, referred in FIG. 3B. In one case, there are one or more encapsulation layer 22'' to cover one or ones of the functional units 182 in a one-on-one manner, referred in FIG. 3C. In one case, there are one encapsulation layer 22 (22', 22'') to cover each of the resilient tiles 14t before slicing, in which the encapsulation layer 22 (22', 22'') may be formed as a single whole layer, or as separate layers in a one-on-one manner. In one case, the encapsulation layer 22 (22', 22'') is functional of color conversion, color filter or the like.

Figure 5B:
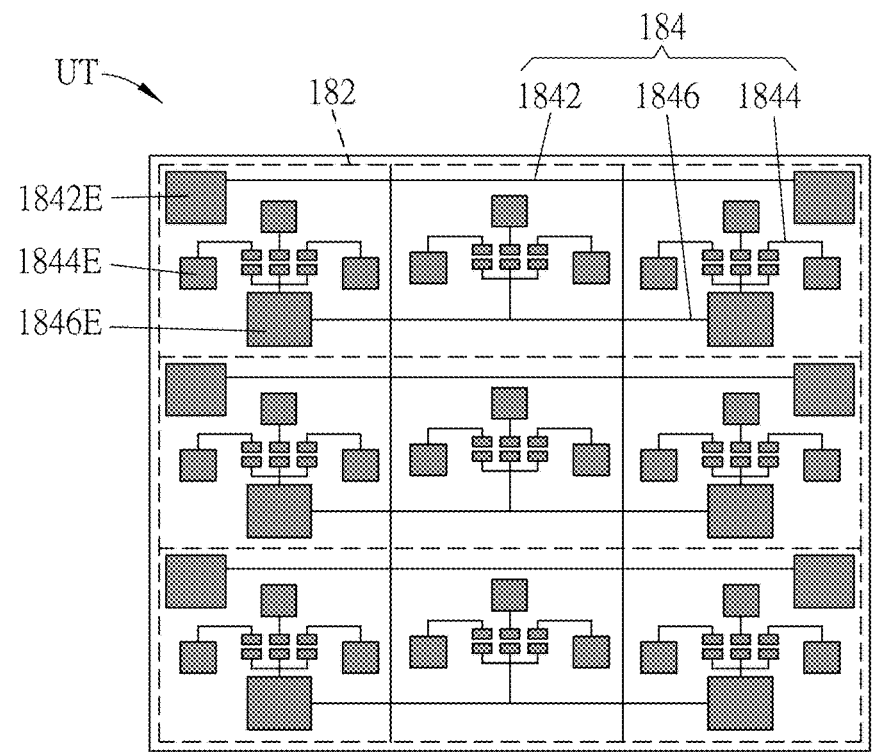

Here are some embodiments for further comprehension in step S11, referred in FIG. 5B. Each of the resilient film 14a defines one or more functional units 182 and one or more second patterned traces 184. In one embodiment, referred in FIG. 5B, a plural of functional units 182 are defined on each of the resilient films 14, a plural of second patterned traces 184 corresponds to the functional units 182, and one or ones of the electrical components 20 are arranged on each of the functional units 182. A unit tile UT would be defined by the resilient film 14 with the functional units 182 in combination with the one or ones of the electrical components 20 as a whole. In this case, three functional units 182 shares one of the second patterned traces 184, and three second patterned traces 184 constitute one unit tile UT. In one embodiment, the conductors 30 may be formed beneath the second patterned trace 184 or pads therefrom, the conductors 30 are capable of hiding beneath the second face S2 of the resilient film 14. In one embodiment, the conductors 30 may be formed at or by the second patterned trace 184 or pads therefrom and are capable of climbing upon the second face S2 of the resilient film 14. Eventually, the conductors 30 provide the second patterned trace 184 electrical connection with the electrical components 20.

In one embodiment, ones of the functional units 182 are arranged in a matrix of m by n on each of unit tile 14t, wherein m and n are positive integers. To be easy comprehension, the second patterned trace 184 includes one or more suppletory traces 1842 being characterized of a second impedance Rs are provided with on the resilient film 14, one or ones of functional circuits 1844 being independent and isolated from the suppletory traces 1842, and one V Com trace 1846 electrically connecting the functional circuit 1844. Each of the suppletory traces 1842 is provided with terminals 1842E formed or extended therefrom; each of the functional circuit 1844 is provided with terminals 1844E formed or extended therefrom; the V Com trace 1846 is provided with terminals 1846E formed or extended therefrom. In this case, referred in FIG. 5D, the terminals 1842E of suppletory traces 1842 of the unit tile UT correspond to and electrically connect with VDD pads 441E of the VDD line 441 of the first substrate 40. The terminals 1844E of functional circuit 1844 of the unit tile UT correspond to and electrically connect with driving member pads 46E isolated from other pads on the first substrate 40. The terminals 1846E of the V Com trace 1846 of the unit tile UT correspond to and electrically connect with the V Com pad 443E of the V Com line 443 of the first substrate 40.

Figure 5C:
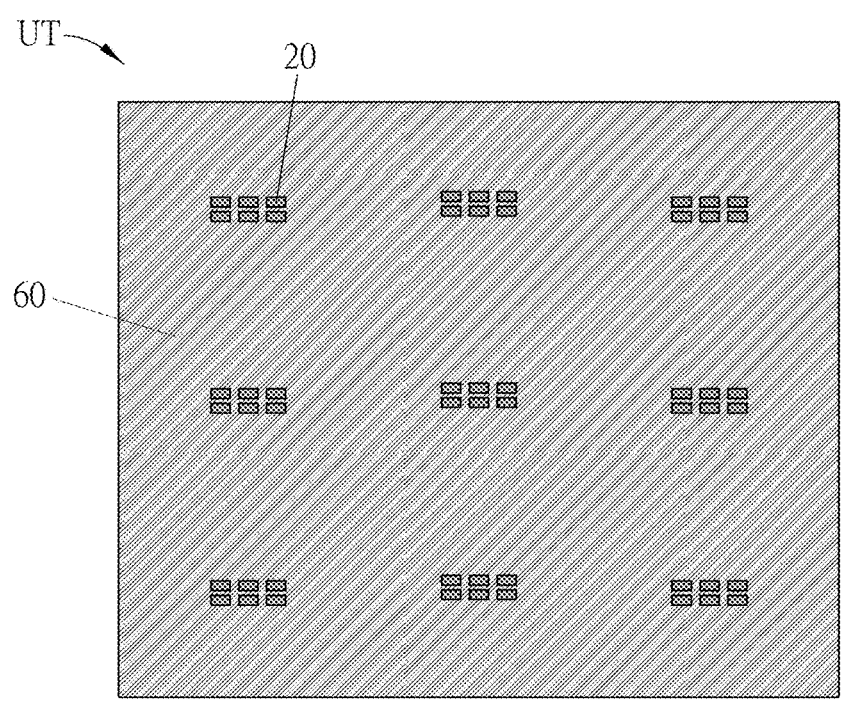
Figure 5D:
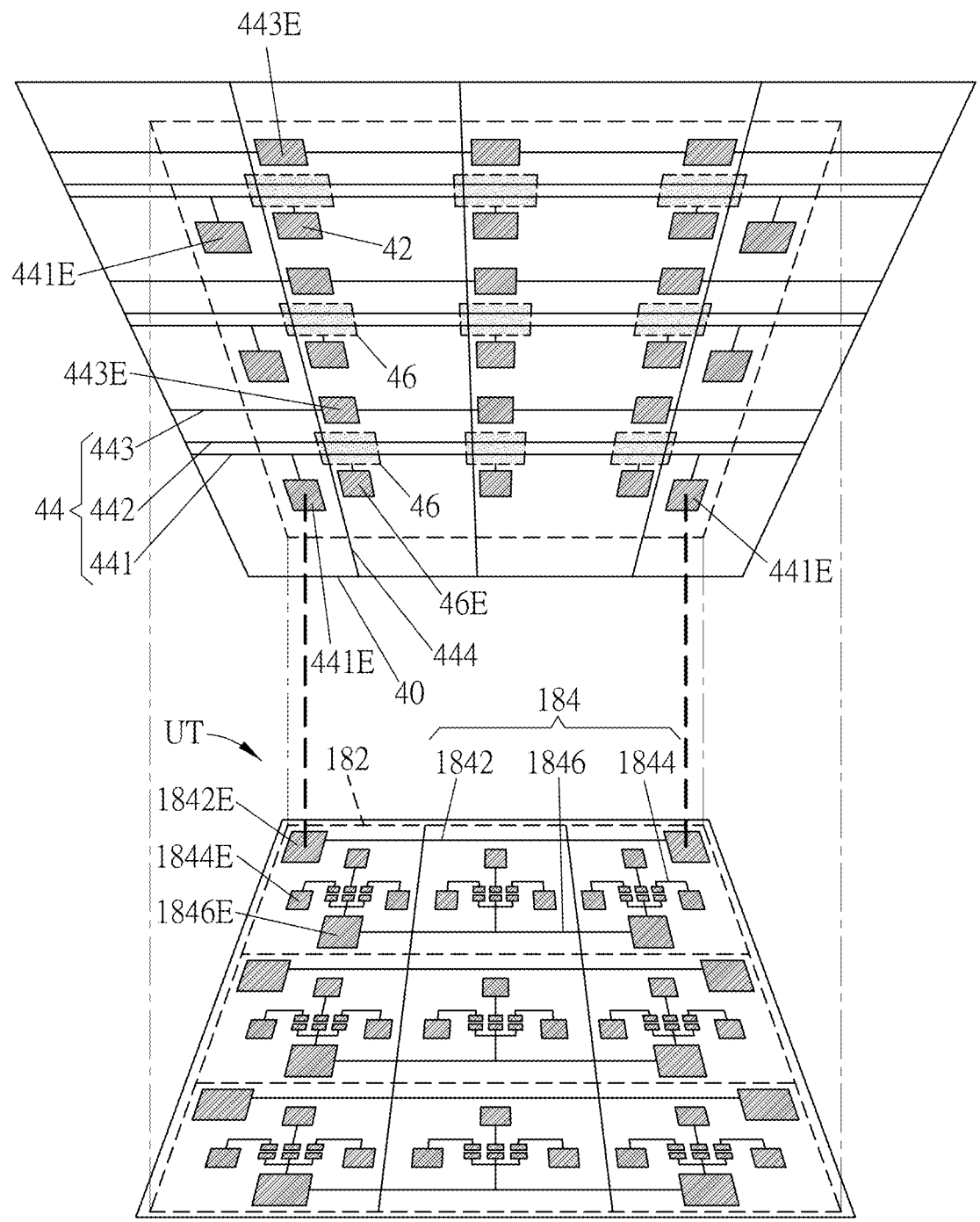

Here are some embodiments for further comprehension in step S11, the unit tile UT, referred in FIG. 5C, is further provided with a black matrix layer 60 on the resilient film 14, and the black matrix layer 60 encompasses around the electrical components 20 and reveals the electrical components 20.

Figure 4A:
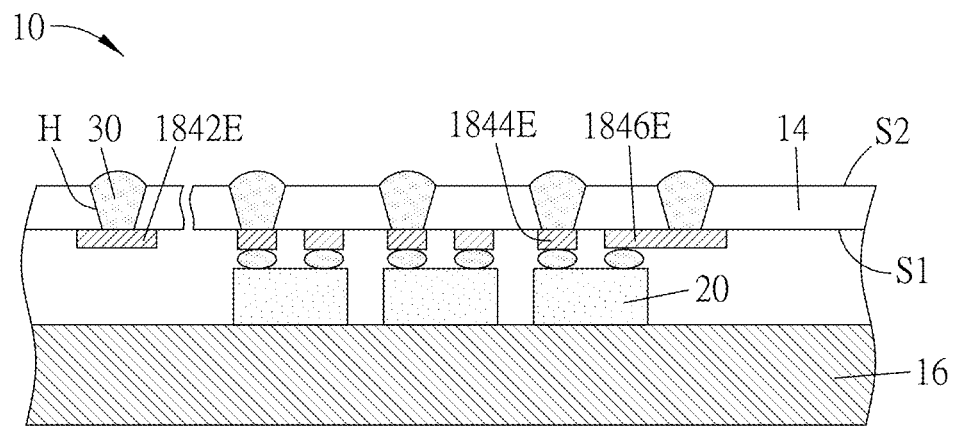
FIG. 4A is an enlargement of FIG. 2D.
Figure 4B:
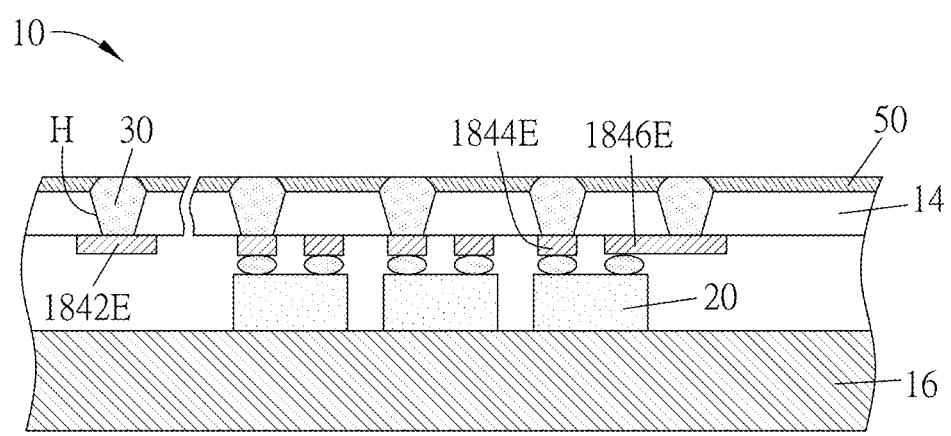
FIG. 4B is an enlargement according to another embodiment of FIG. 2D.

Here are some embodiments for further comprehension before step S14, a planarization layer 50, referred in FIG. 4B, may be further formed on the resilient film 14, and the holes H are through the planarization layer 50. A distal end of one or ones of the conductive members 30 approaches where an exterior face of the planarization layer 50 and is surrounded by the planarization layer 50.

Figure 6A:
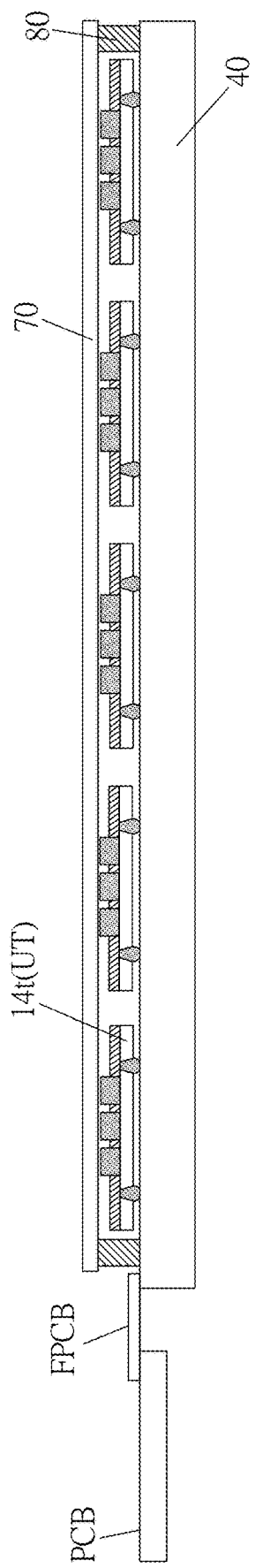
FIGS. 6A to 6B are a top view and a cross-sectional profile according to one embodiment of this disclosure.
Figure 6B:
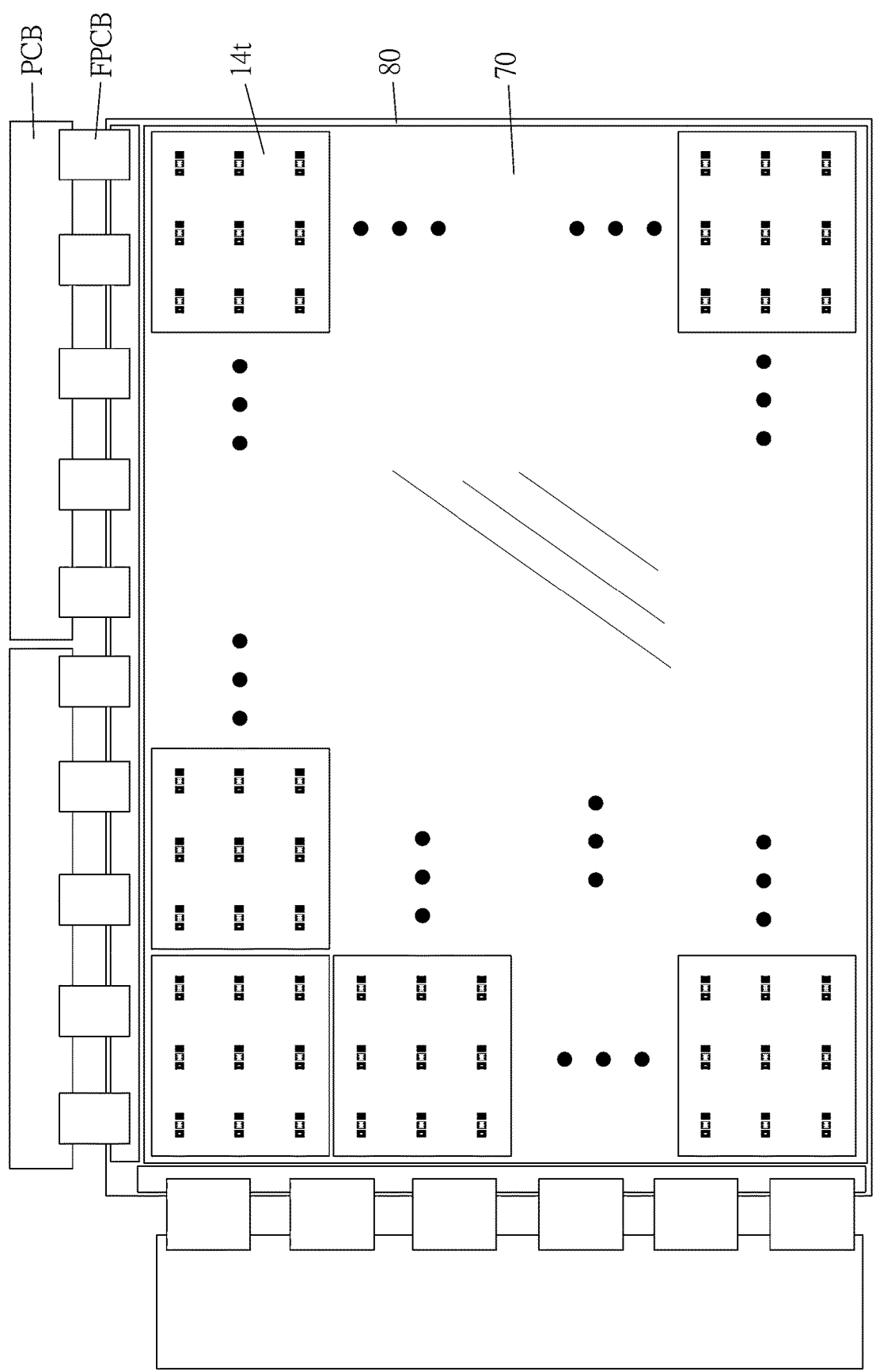

Here are some embodiments for further comprehension after step S18, a cover member 70, referred in FIGS. 6A, which would be for example but not limited to a board or a film, may be further provided on the first substrate 40 and covering the unit tile UT with the resilient tiles 14t, referred in FIGS. 6A and 6B. In one case, the cover member 70 is a glass board, a cover film, or a composite of the glass board and the cover film pasted thereon. In one embodiment after step S18, a seal member 80, referred in FIGS. 6A, may be further provided to encompass a peripheral of the first substrate 40 arranged with the resilient tiles 14t. In one embodiment after step S18, a seal member 80 may be further provided to encompass the peripheral, which is further defined between the first substrate 40 and the cover member 70, while the cover member 70 is offered.

Here are some embodiments for further comprehension before step S18, the first patterned trace 44 of the first substrate 40 is characterized of a first impedance Rt, and one or more suppletory traces 1842 and the first patterned trace 44 are electrically connected in parallel in the progress of electrically connecting the conductors 30 to pads 42 of the first substrate 40. An equivalent resistance is obtained by the parallel electrical connection of the first patterned trace 44 and one or more suppletory traces 1842. In substantial progress, ones of the pads 42 (441E) are electrically connected with the terminals 1842E of a corresponding one of the suppletory traces 1842 in a respective manner by corresponding ones of the conductors 30 accommodated in the holes H. In this case, two terminals 1842E of the suppletory trace 1842 electrically connect to two VDD pads 441E of the VDD line 441, and it results in the equivalent resistance less than the first impedance Rt of the VDD line 441. In one case, the second impedance Rs of the suppletory trace 1842 in a determined interval between the two terminals 1842E thereof is less than the first impedance Rt of the VDD line 441 (first patterned trace 44) in the same constrained interval between two corresponding two VDD pads 441E thereof. To be noted, the equivalent resistance derived from both is less than the first impedance Rt of the VDD line 441 (the first patterned trace 44), and how much it decreases depends on the volume resistance of the suppletory traces 1842, the thickness of the suppletory traces 1842, and the quantity of the suppletory traces 1842. In one embodiment, the first patterned trace 44 of the first substrate 40 are formed of materials, such as IGZO (Indium Gallium Zinc oxide), a-IGZO (amorphous Indium Gallium Zinc oxide), LTPS (polycrystalline Silicon), or a-Si (amorphous Silicon). In one embodiment before step S18, the driving members 46 of the first substrate 40 may be TFTs formed of materials, such as IGZO (Indium Gallium Zinc oxide), a-IGZO (amorphous Indium Gallium Zinc oxide), LTPS (polycrystalline Silicon), or a-Si (amorphous Silicon), or may be are IC chips or IC chiplets, which is based on silicon or non-silicon materials. When the same materials are chosen, the TFTs could be formed together with the first patterned trace 44, but this disclosure is not limited thereto.

A method for fabricating an electronic device according to another one embodiment of the present invention is described as followed. In this case, mostly the steps and structures resemble to the previous embodiment, but the electrical components 20 are disposed on the rigid carrier 12 instead. Thereby, some supportive and removal steps could be omitted, and the following steps would be implemented in the base of the rigid carrier 12. In one embedment, the rigid carrier 12, for example a glass carrier but not limited thereto.

A method for fabricating an electronic device according to a generic embodiment of the present invention is described as followed. In this case, the steps and structures try to picture a generic embodiment to contain at least embodiments mentioned as above, therefore the method comprises steps S21 to S25, referred in FIG. 1B, described, and the highly resembled steps and details would be omitted.

Step S21, in which a base substrate is provided, in which the base substrate could be the rigid carrier 12 or the resilient film 14. The electrical components 20 are disposed on the base substrate.

Step S22, in which a plural of holes H are implemented on the base substrate, and ones of the holes H respectively correspond with ones or all of the electrical components 20.

Step S23, in which a plural of conductors 30 are disposed in the holes H respectively for electrically connecting the electrical components 20.

Step S24, in which the base substrate are sliced into unit tiles UT, wherein ones of the electrical components are set in each of the unit tiles UT.

Step S25, in which the unit tiles UT and the first substrate 40 approach with each other by the conductors 30 facing the pads 42 of the first substrate 40. The first substrate 40 further includes a first patterned trace 44, and a plural of driving members 46 electrically connecting with the first patterned trace 44. The pads 42 electrically connect with the first patterned trace 44 and respectively correspond with one or ones of the driving members 46.

In some cases, ones or all of the holes H are formed beneath extension pads of the second traces. In some cases, the holes H could be aligned with the pads 42 of the first substrate 40, and the conductors 30 accommodated in the holes respectively at least overlaps the pads 42 of the first substrate 40 for later electrical connection.

Figure 7:
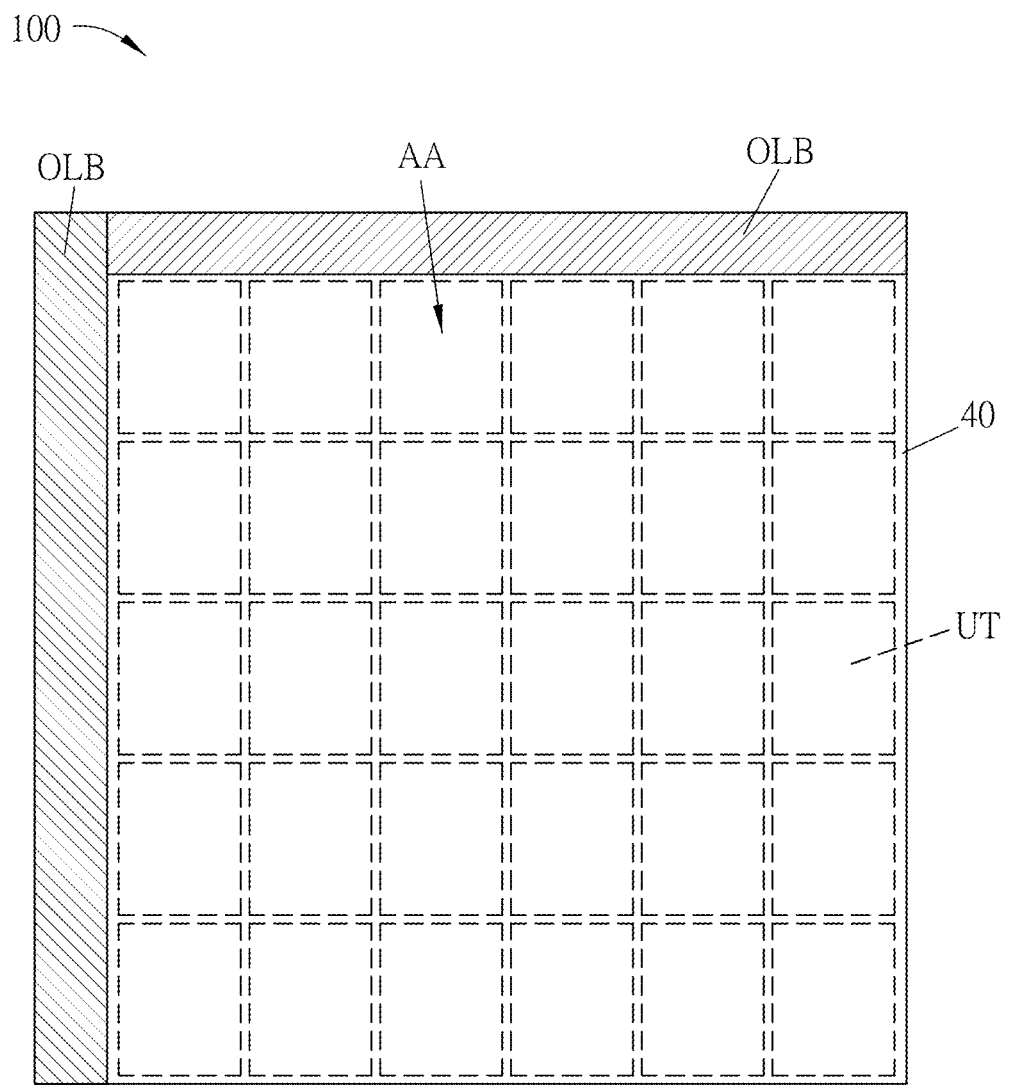
FIG. 7 is a top view according to an overview embodiment of FIG. 5A.

In conclusion, after embodiments mentioned in the previous methods, an electronic device 100, referred in FIG. 7, is formed thereby. The electronic device 100, a display in this case, could define an area of out lead bonding (OLB) area along at least one side edge of the first substrate 40, and an active area AA tiled by the unit tiles UT with a matrix of x by y on the first substrate 40.

For further comprehension, the electronic device 100, referred in FIGS. 6A, 6B and 7, further includes plural of flexible printed circuit boards (FPCB) along at least one side edge of the first substrate 40 and locate at or by the OLB area. One or more printed circuit boards (PCB) connect to the FPCB by a predetermined arrangement.

Figure 8:
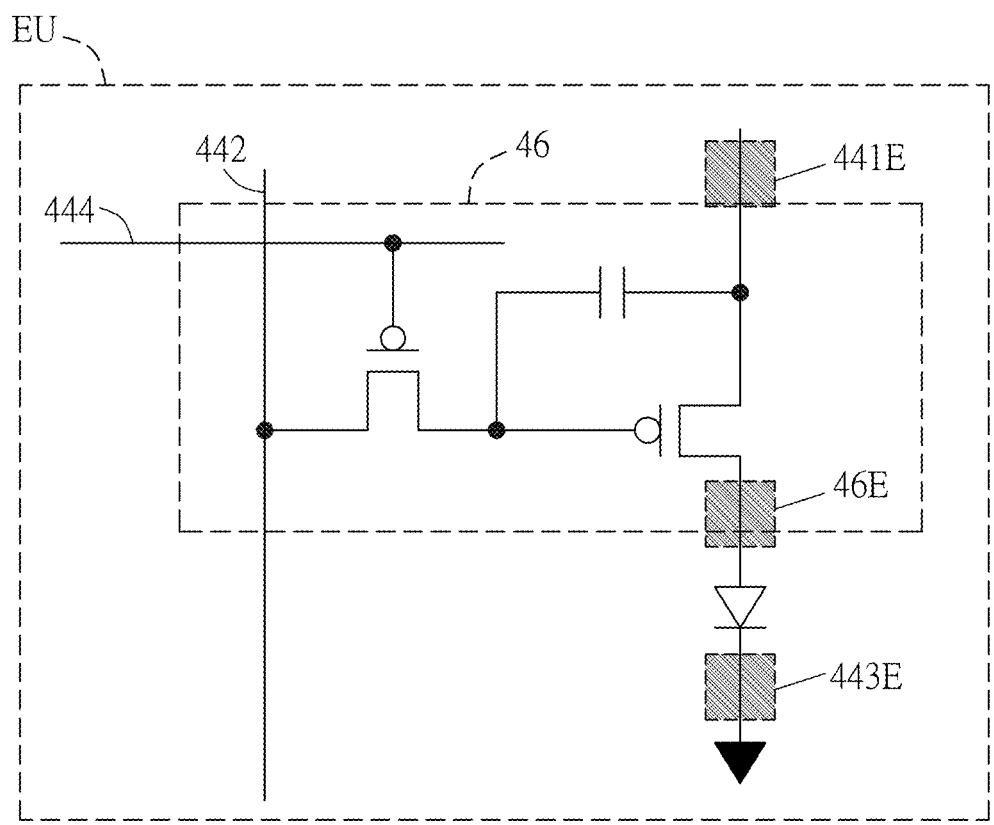
FIG. 8 depicts the electrical function according to one embodiment of this disclosure.

For further comprehension, the electronic device 100, referred in FIGS. 5A, 5B and 8, at least includes the first substrate 40 including the pads 42, the first patterned trace 44, the driving members 46 electrically connected with ones of the first patterned trace 44 and ones of the pads 42 in a predetermined manner. The electrical components 20 are deposed on one face of the unit tiles UT while conductors 30 are exposed at the other face thereof. One or ones of the functional units 182 are defined in each unit tile UT, and one or ones of the electrical components 20 correspond to each of the functional units 182. The conductors 30 electrically connect to ones of the second patterned traces 184 of the unit tiles UT to ones of the pads 42 of the first substrate 40. The suppletory traces 1842 with the second impedance Rs are formed on each of the unit tiles UT to electrically connect the first patterned trace 44 with the first impedance of the first substrate 40 in a parallel-electrical-connection manner. The equivalent impedance is obtained by the parallel electrical connection of the first patterned trace 44 and one or more suppletory traces 1842, and it would lower the IR drop of the power traveling in comparison with the power travels only through the first patterned trace 44 of the first substrate 40. Therefore, one or ones of the electrical components 20, ones of the functional circuit 1844, and one or ones of the driving members 46 constitute an electronical unit EU, referred in FIG. 8. It would be understood that one or ones of the driving members 46 is provided with one or more sub electronical units, such as plural of TFTs in one of the driving members 46.

In summary, embodiments of the present invention are directed to a method making an electronic device and an electronic device thereof being beneficial of retaining slightly power drop with budget cost. The electronic device is beneficial of providing mass production in an effective and efficient manner, advance technology with down-to-earth fabrication, and balance and effectivity between the unique and the convention and of flexibility for the diversities of the display trends.

It should be understood that additional operations can be provided before, during, and after the method, and some of the operations described can be replaced or eliminated for other embodiments of the method.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings.

While the disclosure has been described by way of example and in terms of embodiment, it should be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
a first substrate including a first patterned trace and pads, ones or more of the pads electrically connecting the first patterned trace;
a plural of unit tiles connecting the first substrate, wherein each of the unit tiles includes one or more second patterned traces, each of the second patterned traces includes one or more suppletory traces and one or more functional circuits, and one or ones of the suppletory traces and one or ones of the functional circuits are isolated with each other; and
a plural of electrical components arranged on the unit tiles and electrically connected with the one or ones of the functional circuits of the second patterned trace;
wherein each of the functional circuits is electrically connected with the first patterned trace, the one or more suppletory traces and corresponding ones of the first patterned trace of the first substrate are electrically connected in parallel.

2. The electronic device of claim 1, wherein an equivalent resistance from an electrical parallel connection between the one or more suppletory traces and corresponding ones of the first patterned trace of the first substrate is formed to be less than an impedance of the first patterned trace.

3. The electronic device of claim 2, wherein an impedance of the suppletory trace is less than the impedance of the first patterned trace at a constrained interval.

4. The electronic device of claim 1, wherein dimensions of the electrical components are on or under a level of micrometer scale.

5. The electronic device of claim 1, wherein dimensions of the unit tiles are on a level of millimeter scale.

6. The electronic device of claim 1, wherein ones of the electrical components are arranged in an array on a corresponding one of the unit tiles.

7. The electronic device of claim 1, wherein a plural of functional units are arranged on a corresponding one of the unit tiles in a matrix of m by n, wherein m and n are positive integers.

8. The electronic device of claim 1, further comprising one or more driving members arranged alternatively on the first substrate and on one or ones of the unit tiles, and electrically connected with the corresponding one of the unit tiles.

9. The electronic device of claim 8, wherein the driving member is a transistor formed of IGZO (Indium Gallium Zinc oxide), a-IGZO (amorphous Indium Gallium Zinc oxide), LTPS (polycrystalline Silicon), or a-Si (amorphous Silicon), or are IC chips or IC chiplets.

10. The electronic device of claim 1, further comprising a plural of conductive structures, ones of the conductive structures electrically connect the functional circuits or a corresponding one of the suppletory traces to the first patterned trace.

11. The electronic device of claim 10, wherein the conductive structures include a plural of holes formed through the unit tiles, and a plural of conductors arranged in the holes respectively.

12. The electronic device of claim 11, wherein each of the unit tiles defines a first face facing the first substrate and a second face opposing to the first face, and the conductors are underneath the second patterned trace.

13. The electronic device of claim 11, further comprising a planarization layer formed on the first face of one of the unit tiles, wherein the holes are formed through the planarization layer, and a distal end of one or ones of the conductive members approaches the planarization layer, and is surrounded by and revealed of the planarization layer.

14. The electronic device of claim 10, wherein ones of the holes are formed at or by the one or more suppletory traces, and the one or more suppletory traces and the first patterned trace are electrically connected in parallel via ones of the conductors accommodated the corresponding ones of the holes.

15. The electronic device of claim 1, wherein the first patterned trace is formed of IGZO (Indium Gallium Zinc oxide), a-IGZO (amorphous Indium Gallium Zinc oxide), LTPS (polycrystalline Silicon), or a-Si (amorphous Silicon).

16. The electronic device of claim 1, wherein the electrical components are photoelectrical components.

\* \* \* \* \*